United States Patent [19]

Otofuji

[11] 4,145,662
[45] Mar. 20, 1979

[54] SWEEP CONTROL CIRCUIT FOR OSCILLOSCOPE

[75] Inventor: Kiyoshi Otofuji, Kodaira, Japan

[73] Assignee: Hitachi Denshi Kabushiki Kaisha, Japan

[21] Appl. No.: 839,255

[22] Filed: Oct. 4, 1977

[30] Foreign Application Priority Data

Oct. 6, 1976 [JP] Japan .................. 51-119379

[51] Int. Cl.² .............................................. H03K 4/08
[52] U.S. Cl. ................................... 328/181; 307/228; 307/247 A
[58] Field of Search .................. 307/228, 247 A; 328/181

[56] References Cited

U.S. PATENT DOCUMENTS

| | | | |
|---|---|---|---|
| 3,215,948 | 11/1965 | Dalton | 328/181 X |
| 3,358,159 | 12/1967 | Smith | 328/181 X |
| 3,408,580 | 10/1968 | Moriyasu | 307/228 X |
| 3,432,762 | 3/1969 | Porta | 328/181 X |
| 3,718,825 | 2/1973 | Matsuoka | 307/228 |

*Primary Examiner*—John S. Heyman
*Attorney, Agent, or Firm*—Craig & Antonelli

[57] ABSTRACT

A sweep control circuit for an oscilloscope comprises a gate control circuit such as flip-flop which is applied with a hold-off signal from a hold-off circuit and latched by a trigger input signal, a free running control circuit such as NAND gate which mask-controls the hold-off signal to control a free running at an automatic sweep mode and a ground free running at a normal sweep mode, and a single reset circuit which couples a differentiated pulse signal to the hold-off circuit at a single sweep mode. To the hold-off circuit may be coupled a sweep stop made establishing circuit and a circuit for reducing the rise time of the hold-off signal.

12 Claims, 1 Drawing Figure

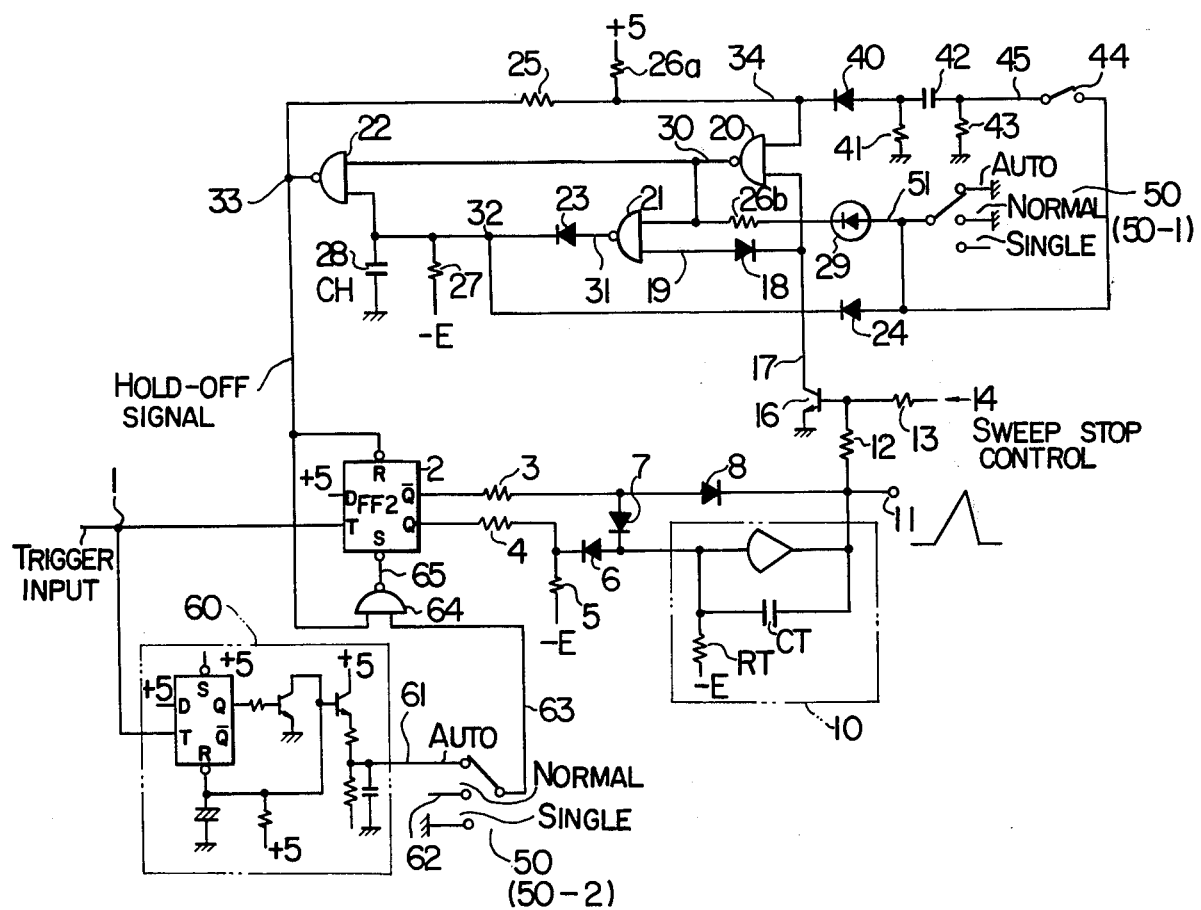
FIG.

SWEEP CONTROL CIRCUIT FOR OSCILLOSCOPE

LIST OF PRIOR ART REFERENCES (37 CFR 1.56 (a))

The following references are cited to show the state of the art:

(1) U.S. Pat. No. 3,215,948 Dalton Nov. 2, 1965
(2) Japanese Patent Application Laid-Open No. 6,959/74 Mitsui Jan. 22, 1974.

BACKGROUND OF THE INVENTION

This invention relates to an improvement in a sweep control circuit used in a measuring instrument such as an oscilloscope.

A typical one of conventional sweep control circuits of the prior art is a system in which a tunnel diode is used as a gate circuit. This system using the high speed switching characteristic of the tunnel diode has an advantage that the trigger sweep by a high frequency signal is possible. The system therefore finds a wide use in the field of high frequency oscilloscopes.

However, according to such a sweep control circuit, the operation of sweep mode control and the operation of hold-off are logically performed by so many discrete parts such as transistors and diodes that the overall circuit is disadvantageous in view of the demand for reducing power consumption and cost. Moreover, in order to decrease the number of logic elements such as transistors and diodes especially in a sweep mode control section, a multiplicity of contacts of sweep mode switches are sometimes substituted for them. Accordingly, the number of the circuits associated with the contacts increases to further complicate the switch system and also to add to wiring work. This goes counter to the trend toward the reduction of the size of device. Further, the tunnel diodes are poor in reliability as well as expensive. In addition thereto, since the voltage derivable from the tunnel diode has a small amplitude, a gate signal amplifier must be employed to have the gate control for a Miller integrator circuit.

Concerning the above-described drawbacks of the conventional sweep control circuit, it is noted that the tunnel diodes can be easily replaced by flip-flops of IC configuration in the gate circuit section, but that the IC version of the sweep control circuit including a sweep mode control function and a hold-off function as well as the gating function has been put into practice only in a few examples since it is very difficult to realize such as IC version having satisfactory merits in comparison with the conventional equivalent of discrete type. Therefore, the circuits of discrete type using tunnel diode are still used even today.

In the field of oscilloscopes, however, the demand for reducing cost, size and power consumption and for increasing reliability has recently increased. Also, there is a great need for an IC sweep control circuit which is capable of replacing a conventional circuit of discrete type using tunnel diodes and has some advantages over the conventional circuit.

SUMMARY OF THE INVENTION

An object of this invention is to provide a practical sweep control circuit in which no tunnel diode is necessary and the number of the circuit elements of the whole circuit including the contacts of the sweep mode switches is reduced so that the reliability is improved, the price is low, the size is small and the power consumption is low.

According to this invention, a variety of logic operations such as sweep mode control and hold-off function can be performed by a simplified small-scale IC since the sweep control circuit is in the form of a logic IC and the logic IC is supplemented with a small number of discrete circuit elements.

In an embodiment of this invention, each of a flip-flop IC and a NAND gate IC is fabricated in a single package. The flip-flops are used as gates or automatically triggerable multivibrators since they can be latched by trigger input signals. The NAND gates are used in a hold-off circuit since the gates in combination with positive feedback configurations can function as monostable or bistable multivibrators. Further, discrete elements such as diodes, resistors and capacitors supplement the logic elements. Thus, the operation of a multifunctional sweep control circuit is performed by a small-scale circuit.

BRIEF DESCRIPTION OF THE DRAWING

The FIGURE shows a sweep control circuit used in an oscilloscope, as an embodiment of this invention.

DESCRIPTION OF THE PREFERRED EMBODIMENTS

In the FIGURE showing a sweep control circuit as an embodiment of this invention, reference numeral 1 indicates a trigger input terminal, numeral 2 a gate circuit formed of a D-type flip-flop, numerals 3, 4 and 5 resistors, numerals 6, 7 and 8 diodes constituting a gate, numeral 10 a Miller integrator circuit having an output terminal 11, numerals 12 and 13 resistors for detecting a sweep length, and numeral 14 a sweep stop control line to which a voltage of +5 V is supplied at the time of sweep stop and a voltage of −E in the modes other than the sweep stop, numeral 16 a transistor having an output 17, numeral 18 a diode, numeral 19 a signal line which connects the output of the transistor 16 with the input of a NAND gate 21 through the diode 18, numerals 20 and 22 NAND gates, numerals 23 and 24 diodes, numerals 25 and 26 resistors in which an offset voltage of several hundreds of millivolts generated due to a bias current through the resistor 26 is applied to the resistor 25, numeral 27 a discharge resistor for hold-off, numeral 28 a capacitor for hold-off, numeral 29 a "ready" lamp which is a light-emitting diode, numeral 30 an output of the NAND gate 20, numeral 31 an output of the NAND gate 21, numeral 32 one of the two inputs of the NAND gate 22, numeral 33 an output of the NAND gate 22 which is a hold-off signal, numeral 34 one of the two inputs of the NAND gate 20, numeral 40 a diode, numeral 41 a resistor, numeral 42 a differentiating capacitor, numeral 43 a discharge resistor, numeral 44 a reset switch for single sweep mode having an output 45 at its contact, numeral 50 a sweep mode switch having two contact circuits 50-1 and 50-2, numeral 51 a contact output of the circuit 50-1, numeral 63 a contact output of the circuit 50-2, numeral 60 an automatically triggerable multivibrator having its output 61, numeral 62 a control line for the ground free running at the time of normal sweep, to which a voltage of +5 V is supplied at the time of the ground free running and a ground potential is applied at the time other than the time of the ground free running, and numeral 64 a NAND gate for free running control having its gate output 65.

In a sweep operation, a trigger input pulse arriving at the trigger input terminal 1 actuates the gate circuit 2 whose output causes the Miller integrator circuit 10 to run up. As a result, a sweep signal of saw-tooth waveform is generated. In this case, the gate circuit 2 is controlled in various manners in accordance with the hold-off and sweep mode operations.

The hold-off operation is to hold the flip-flop FF2 as the gate circuit 2 for a constant time so as to prevent the gate circuit 2 from being actuated by the trigger pulse as the trigger input terminal 1 during the time for which the output level of the Miller integrator circuit 10 at the end of sweep is reset to that at the beginning of sweep. A hold-off circuit for holding the flip-flop FF2 usually generates a single pulse, resembling the operation of a monostable multivibrator to which the output of a sweep length detector is supplied and the pulse duration, namely, hold-off time is determined depending on a time constant defined by the resistor and the capacitor.

The sweep mode defines the scheme of the trigger sweep. Most of ordinary oscilloscopes use three modes of "automatic", "normal" and "single". In case of the "automatic" sweep, the trigger synchronous sweep is performed at the arrival of the trigger signal while an asynchronous self-sustained sweep or free running is performed independent of the trigger signal when the trigger signal is absent or when the trigger period is relatively long. In the "normal" sweep, only the trigger synchronous sweep is performed and therefore continues to cease in the absence of the trigger signal. In the "single" sweep, the trigger synchronous sweep is performed in response to the firwt trigger pulse but no sweep takes place for the following trigger pulses. The operations in these sweep controls will be now described.

AUTOMATIC SWEEP

In the case of the automatic sweep, the sweep mode switch 50 selects a contact labelled "AUTO". When the flip-flop FF2 as the gate circuit 2 is in its ready state, the Q and $\overline{Q}$ outputs become low and high levels respectively so that all the diode gates 6, 7 and 8 are turned on to reset the Miller integrator circuit 10. At this time, since the output 61 of the automatically triggerable multivibrator 60 is low and therefore masks the NAND gate 64, the R input 33 and the S input 65 of the flip-flop FF2 are both high and ready to be latched by the trigger input T. Accordingly, the input 30 of the NAND gate 22 is low and the output 31 of the NAND gate 21 is high, so that the other input 32 of the NAND gate 22 becomes high. Further, the input 34 of the NAND gate 20 becomes high since the output 33 of the NAND gate 22 is high and applied through the resistor 25 of the NAND gate 20.

If the trigger input terminal 1 receives a trigger pulse when the flip-flop FF2 is in the ready state, the flip-flop FF2 is latched to cause the Q output to become high and the $\overline{Q}$ output to be inverted to the low level so that all the diode gates 6, 7 and 8 are turned off. As a result, the Miller integrator circuit 10 is caused to run up from the reset state to an integrating state so that the output 11 has a positive saw-tooth waveform. Now, since a voltage of −E is applied to the sweep stop control line 14, the transistor 16 is turned on by the voltage level of the saw-tooth waveform corresponding to the ratio of the resistances of the sweep length detecting resistors 12 and 13. The input 17 of the NAND gate 20 becomes low and its output turns high. Simultaneously, the output 31 of the NAND gate 21 turns low in a moment while the input 32 of the NAND gate 22 continues to be high by reversely biassing the diode 23 during the time depending on a time constant determined by the hold-off capacitor 28 and the discharge resistor 27. Accordingly, the output 33 of the NAND gate 22 remains low during a constant time determined in accordance with the above-mentioned time constant and the low-maintained output serves as a hold-off signal for the gate circuit 2 to reset the flip-flop FF2. Then, the Q and $\overline{Q}$ outputs of the flip-flop FF2 become low and high respectively so that the Miller integrator circuit 10 is reset to lower its output 11 to the level at the beginning of sweep. At this time, the transistor 16 is turned from the conductive state of the cut-off state and therefore the input 17 of the NAND gate 20 resumes to be high. However, since the output 33 of the NAND gate 22 at the low level is positively fed back to the NAND gate 20 through the resistor 25, the output 33 of the NAND gate 22 continues to be low so that the transition of the transistor 16 to the cut-off state has no influence upon the output.

After the output 11 of the Miller integrator circuit 10 has been settled to the level at the beginning of sweep, the hold-off capacitor 28 discharges to a level equal to the threshold voltage of the input 32 of the NAND gate 22. Consequently, the output 33 of the NAND gate 22 is changed from the low level to the high level and then maintained high since a positive feedback is applied through the resistor 25 to the input 34 of the NAND gate 20. This eliminates the reset signal or hold-off signal for the gate circuit 2 supplied to the R input of the flip-flop FF2 so that the gate circuit is again set in the ready state. Meanwhile, the output 30 of the NAND gate 20 is changed from the high level to the low level whereby the output 31 of the NAND gate 21 makes a transition from the low level to the high level. As a result, the hold-off capacitor 28 is rapidly charged through the diode 23 to reset this time constant circuit for hold-off operation to its initial state.

The foregoing is the description of the operation of the trigger synchronous sweep when the trigger signal is applied at the time of automatic sweep and the self-sustained sweep or free running in the absence of the trigger signal will be described below.

In the absence of the trigger signal, the output 61 of the automatically triggerable multivibrator 60 is high and the output 63 of the sweep mode switch 50-2 becomes high so that the NAND gate 64 for free running control is released from its masked state and set in the ready state. Accordingly, if the output 33 of the NAND gate 22 is high, the output 65 of the NAND gate 64 is low to set the flip-flop FF2. This causes the Q and $\overline{Q}$ outputs of the flip-flop FF2 to be high and low respectively, the Miller integrator circuit 10 runs up to perform the same operation as the synchronous sweep responsive to the trigger signal, and the hold-off signal appears at the output 33 of the NAND gate 22 when the sweep output 11 reaches the sweep length level. The hold-off signal not only resets the R input of the flip-flop FF2 but also changes the S input from the low level to the high level by means of the NAND gate 64 to release the flip-flop FF2 from its set state. As a result, the Q and $\overline{Q}$ outputs of the flip-flop become low and high respectively to reset the Miller integrator circuit 10. Thereafter, the output 33 of the NAND gate 22 is again changed from the low level to the high level after a constant time for hold-off has lapsed, so that the flip-flop FF2 is again set to repeat such an operation as described above. Namely, this repeated operation is the self-sustained sweep operation in the absence of the trigger signal.

NORMAL SWEEP

In the case of the normal sweep, the sweep mode switch 50 selects a contact labelled "NORMAL".

The normal sweep basically resembles the trigger synchronous sweep, i.e., automatic sweep responsive to the trigger signal, but the difference lies in that a fixed potential is applied to the contact input 62 of the sweep mode switch 50-2, irrespective of whether there is a trigger input or not. For example, if the contact input 62 is at the ground potential, the NAND gate 64 for free running control is masked and therefore only the trigger input is supplied to the flip-flop FF2 to start sweep. Accordingly, the trigger synchronous sweep takes place in response to the trigger signal and in the absence of the trigger signal the flip-flop FF2 is in the ready state and the sweep operation continues to be stopped.

The above description is given to the normal sweep operation in general, but the circuit according to this invention can be easily arranged for the ground free running operation well-known as a supplementary function in the normal sweep. Namely, the ground free running is to sweep a screen of the oscilloscope with the ground level through self-sustained sweep when an input coupling switch of a vertical amplifier selects its ground contact. As for the present circuit, the same operation as the self-sustained sweep in the absence of the trigger signal can be performed irrespective of the trigger signal if a special wiring is provided in such a manner that the contact input 62 is set at +5 V when the input coupling switch (not shown) selects the ground contact. This means that the ground free running function can be realized by a much simplified arrangement.

SINGLE SWEEP

In the case of the single sweep, the sweep mode switch 50 selects a contact labelled "SINGLE". The single sweep operation different from the automatic and the normal sweep operations needs no hold-off signal in the form of a single pulse after each sweep. Namely, after the first sweep, the flip-flop has only to be clamped at its set state in a bistable multivibrator operation. It is needless to restore the flip-flop again to its ready state by the hold-off signal in a monostable multivibrator operation as in the automatic or normal sweep. The restoration of the flip-flop to the ready state is carried out usually through the manual operation of the single reset siwtch indicated at 44 in the FIGURE.

Now, the single sweep operation will be described. When the flip-flop FF2 in the ready state is latched by the first input single trigger pulse, the Miller integrator circuit 10 starts sweeping. When the sweep output 11 reaches the end point of sweeping, the transistor 16 turns on to turn the output 30 of the NAND gate 20 high and the output 33 of the NAND gate 22 low so that the flip-flop FF2 is reset to reset the output 11 of the Miller integrator circuit 10 to the level at the starting point of sweeping. Meanwhile, the time constant circuit for hold-off including the resistor 27 and the capacitor 28 remains clamped at about 4.3 V through the diode 24 and therefore the hold-off signal in the form of a pulse determined by the time constant is not generated. Thus, the circuit performs the operation of a bistable multivibrator so that the output 33 of the NAND gate 22 remains at the low level to continue to reset the flip-flop FF2. This means that after the sweep due to the first trigger pulse on sweep is allowable in response to the following trigger signals. This is the way of the single sweep.

Next, in order to set the flip-flop FF2 in the ready state after the first sweep, it is only necessary to forcibly apply a differentiated pulse having a high level to the positive feedback path through which the output 33 of the NAND gate 22 is supplied as the low level to the input 34 of the NAND gate 20. The high-level differentiated pulse collapses the low-level positive feedback for a very short time and since the input 17 of the NAND gate 20 is already high, the output 33 of the NAND gate 22 becomes high for the moment due to the output 30 of the NAND gate 20. Thus, the high level is supplied to the input 34 of the NAND gate 20 through the positive feedback path so that the output 33 of the NAND gate 22 becomes high to set the flip-flop FF2 in the ready state. The high-level differentiated pulse can be obtained by turning the single reset switch 44 on. Namely, when a voltage of +5 V from the single reset switch 44 is supplied to the differentiating circuit including the capacitor 42 and the resistor 25, a high-level differentiated pulse of about 4.3 V is generated as the input 34 of the NAND gate 20. However, a single reset switch usually produces chattering noises, too and a single operation of the switch will generate plural differentiated pulses, which tend to be a cause of erroneous operations in the single sweep. According to the circuit embodying this invention, such a chattering phenomenon is prevented by making the resistance value of the resistor 43 high (the resistance of the resistor 41 is much lower than that of the resistor 43) and therefore the circuit according to this invention can be said to be much simplified in comparison with the conventional circuit of the same purpose. Namely, when the single reset switch 44 turns on, the capacitor 42 is almost instantaneously charged up to +5 V. If, however, the discharging time constant depending on the capacitor 42 and the resistor 43 is set relatively long, the discharge or the change in the stored voltage of the capacitor 42 hardly takes place during the instantaneously repeated on-and-off of the switch 44, i.e., chattering, upon the closure thereof. In addition, with the aid of the forward voltage margin of the diode 40, the influence of chattering on the input 34 of the NAND gate 20 becomes extremely small.

Now, description will be made of the ready lamp for indicating that the flip-flop is in its ready state. Since the output 30 of the NAND gate 20 is necessarily low in the ready state of the flip-flop FF2, the ready lamp 29 is lit by being energized through a resistor 26b. On the contrary, the lamp 29 is not lit after sweep since the output 30 is then high. Incidentally, with the conventional circuit which is constituted of discrete elements, various bias elements are used to light such a ready lamp. According to the circuit embodying this invention, however, the ready lamp 29 is driven directly by the output of a NAND gate with the use of a single resistor 27b for limiting the current through the lamp. Therefore, the circuit according to this invention has a very simplified constitution.

Some oscilloscopes have a sweep stop function besides the above-described automatic, normal and single sweep modes. The sweep stop operation is to stop the sweep at any desired moment irrespective of the trigger signal and in this case the flip-flop is not in ready state but in the reset state. In the circuit shown, a very simple method for performing a sweep stop operation is employed. The method uses only a control line 14. Namely, the sweep stop control line 14 is normally kept at a voltage of $-E$ and the transistor 16 is always conductive if the line 14 is kept at $+5$ V, that is, if the line 14 is kept at a voltage equal to the sweep length level, the lines 17 and 19 are both kept at the low level so that the inputs 30 and 32 of the NAND gate 22 become both high. Accordingly, the output 33 of the NAND gate 22 is set to the low level and the flip-flop FF2 is always in the reset state so that a sweep stop mode is obtained.

Here, attention should be paid to the function of the diode 18. The diode 18 has no function in the automatic, normal and single sweep operations. For example, when the sweep output 11 reaches the sweep length level, the line 17 is kept at the low level which is about 1.4 volts and determined by the threshold voltage of the NAND gate 20. The input 19 of the NAND gate 21 is always at the high level since it is equal to this voltage of about 1.4 V plus the forward voltage of the diode 18, so that the diode 18 theoretically plays no role. However, since the transistor 16 completely turns on in the sweep step mode with its voltage drop of almost 0V, this diode turns on in the forward direction. As a result, the input 19 of the NAND gate 21 becomes a low level of about 0.7 V whereby the flip-flop FF2 can be driven into the reset state.

Further, it should be noted that a bias current through the resistor 26a develops an offset voltage of several hundreds of millivolts across the resistor 25. The hold-off signal depends on the discharge characteristic of the hold-off capacitor 28 and before the gain of the positive feedback loop including the NAND gate 22 and the NAND gate 20 exceeds unity, the hold-off signal rises relatively slowly. On the other hand, when the gain reaches a value larger than unity, that is, when the input threshold voltage of 1.4 V of the NAND gate 20 is reached, the hold-off signal jumps up to the high level at the greatest operation speed of the NAND gate IC so that the R input of the flip-flop FF2 is released from the reset state. Since the threshold voltage of the R input of the flip-flop FF2 is almost equal to that of the NAND gate IC, the time required for releasing the R input of the flip-flop FF2 from the reset state becomes too long so that the time for which the hold-off time overlaps the trigger signal becomes longer. So, such an adverse effect as a jittering phenomenon in the output circuit of the NAND gate may be incurred. In order to solve such a problem, an offset voltage of several hundreds of millivolts is applied between the output of the NAND gate 22 and the input of the NAND gate 20 so that the level of the R input of the flip-flop FF2 may be lower than the threshold level of the input of the NAND gate 20 by the offset voltage, whereby the reset state of the R input of the flip-flop FF2 is released by the jump waveform which is the fastest rising portion of the hold-off signal.

There are used two kinds of IC's in the circuit shown in the FIGURE: NAND gate IC and flip-flop IC. A commercial NAND gate IC usually has four two-input NAND gates per one package and a commercial flip-flop IC has two flip-flops per one package. Therefore, the sweep control circuit according to this invention, inclusive of the flip-flop of the automatically triggerable multivibrator 60 can be constituted of one package of commercial NAND gate IC and one package of commercial flip-flop IC. Namely, according to this invention, a complicated logic for a sweep control circuit can be obtained by using only two ordinary basic logic IC's. As seen from the circuit in the FIGURE, no input or output terminal of each IC is left idle, that is, every terminal is effectively used for interconnection. Further, a multi-logic sweep control circuit can be obtained as a small-scale IC by supplementing the IC with a small number of discrete elements.

It should here be noted that the circuit shown in the FIGURE is one embodiment of this invention and that it by no means limits this invention. For example, the flip-flop need not be limited to a D type, but a J-K type flip-flop may be used. The R and S inputs of the flip-flop are interchangeable. Each NAND gate may have more than two inputs. Each IC may be of Schottky TTL or DTC configuration as well as of TTL configuration.

Finally, the circuit according to this invention will be compared with the conventional circuit. In the circuit embodying this invention, the flip-flop IC is used as a gate circuit while in the conventional circuit the tunnel diode is used as the gate circuit. This is not the simple substitution of the flip-flop IC for the tunnel diode, but the excellent characteristics of the IC are used to advantage. For example, a free running operation can be performed by using the S or R input of the flip-flop IC. Further, since the flip-flop IC has an output of high amplitude, the Miller integrator circuit can directly driven without using any amplifier for the gate signal. These mean that the number of the circuit elements can be decreased to a considerable extent in comparison with the conventional circuit using tunnel diodes. Among various conventional sweep mode switches, a typical one has three or four circuits each having three contacts. In comparison with this, the sweep mode switch 50 has two circuits each having three contacts. A commercial two-circuit three-contact sweep mode switch has a very small size and the use of such a two-circuit three-contact switch has a great merit in view of miniaturization. The decrease in the contact circuits accompanies the decrease in wiring work. Here, it is especially notable that all the signals in this circuit have fixed levels (ground level or $+5$ V) or low-frequency signals as the output 61 of the automatically triggerable multivibrator, whereby a so-called level control method can be employed. With the conventional circuit, the sweep mode switch directly changes over the internal signals varying like pulses, is most cases, to simplify the logic and to decrease the number of elements. Accordingly, the means for preventing the crosstalks among signal lines can be realized only with difficulty increasing with the decrease in size. Namely, the sweep mode switch according to this invention, having a smaller number of contact circuits, can effectively prevent crosstalks and promote miniaturization.

As apparent from the foregoing, the following advantages can be obtained according to this invention.

(1) The ground free running operation in the normal sweep can be performed by simply controlling the voltage at the line 62.

(2) The differentiated pulse generating circuit of single reset type can be constituted of a simple IC having the differentiating capacitor 42 and the discharge resistor 43 having a high resistance.

(3) The ready lamp can be lit up by the provision of the current limiting resistor 26 alone.

(4) The sweep stop operation can be performed by merely controlling the voltage at the line 14.

As described above, according to this invention, the sweep control circuit is fabricated in IC configuration and therefore simplified in structure. Moreover, with the exclusion of tunnel diodes, the number of the used elements can be decreased to a considerable extent and this can lead to the reduction in cost, size and power to be consumed and to the improvement in reliability.

I claim:

1. A sweep control circuit for an oscilloscope comprising:
    a gate circuit means having a hold-off input to which a hold-off signal is applied, a trigger input to which a trigger signal is applied, and a free running control input, said gate circuit means being latched by said trigger signal;
    a free running control circuit means connected with said free running control input of said gate circuit means for mask-controlling said hold-off signal applied to said gate circuit means to control a free running at an automatic sweep mode and a ground free running at a normal sweep mode;
    a hold-off circuit means for generating said hold-off signal and forming a hold-off time; and
    a single reset circuit means for generating a differentiated pulse signal at a single sweep mode to couple the same to said hold-off circuit means, said single reset circuit means including a single reset switch and a chattering preventing circuit for preventing the chattering of said switch.

2. A sweep control circuit according to claim 1, further comprising a sweep stop mode establishing circuit means coupled to said hold-off circuit means and responsive to a sweep stop control signal to provide a sweep stop mode.

3. A sweep control circuit according to claim 1, further comprising a circuit means coupled to said hold-off circuit means for reducing the rise time of said hold-off signal to diminish the overlapped time between said hold-off signal and said trigger signal.

4. A sweep control circuit according to claim 1, wherein said gate circuit means includes a flip-flop, said hold-off input being one of set and reset inputs of said flip-flop.

5. A sweep control circuit according to claim 1, wherein said free running control circuit means includes a NAND gate circuit having one input to which said hold-off signal is applied, the other input at which said hold-off signal is mask-controlled, and an output with which said free running control input of said gate circuit means is connected.

6. A sweep control circuit according to claim 1, wherein said hold-off circuit means includes a first NAND gate whose one input is connected with a sweep length detecting circuit, second and third NAND gates whose respective one input is connected with the output of said first NAND gate, a positive feedback path inserted between the output of said third NAND gate and the other input of said first NAND gate, and a time constant circuit having a first capacitor and a first discharge resistor connected through a diode with the output of said second NAND gate, said time constant circuit being connected with the other input of said third NAND gate to form said hold-off time, said other input of said first NAND gate being driven by the output of said sweep length detecting circuit to generate said hold-off signal.

7. A sweep control circuit according to claim 6, wherein single reset circuit means includes said single reset switch, a second capacitor connected in series with said switch, a second discharge resistor of high resistance connected with one end of said second capacitor, a diode whose one end is connected with said one end of said second capacitor and whose other end is connected with said other input of said first NAND gate, said second capacitor and said second discharge resistor providing said chattering preventing circuit.

8. A sweep control circuit according to claim 7, wherein said single reset circuit means further includes a diode for clamping said time constant circuit and a ready lamp connected with the output of said first NAND gate for indicating a ready state of said gate circuit means.

9. A sweep control circuit according to claim 6, further comprising a sweep stop mode establishing circuit means coupled to said hold-off circuit means and responsive to a sweep stop control signal to provide a sweep stop mode.

10. A sweep control circuit according to claim 9, wherein said sweep stop mode establishing circuit means includes said sweep length detecting circuit having a sweep length detecting resistor whose one end is coupled to said sweep stop control signal and a transistor whose base is connected with the other end of said sweep length detecting resistor, the output of said sweep length detecting circuit being connected with said one input of said first NAND gate and through a diode with said other input of said second NAND gate, the voltage level of said sweep stop control signal coupled to said sweep length detecting resistor being controlled to always maintain said gate circuit means at its reset condition for the sweep stop mode.

11. A sweep control circuit according to claim 6, further comprising a circuit means coupled to said hold-off circuit means for reducing the rise time of said hold-off signal to diminish the overlapped time between said hold-off signal and said trigger signal.

12. A sweep control circuit according to claim 11, wherein said circuit means for reducing the rise time of said hold-off signal includes a resistor inserted in said positive feedback path of said hold-off circuit means.

* * * * *